(12) United States Patent
Downes et al.

(10) Patent No.: US 10,078,272 B2
(45) Date of Patent: Sep. 18, 2018

(54) LITHOGRAPHIC METHOD AND APPARATUS

(71) Applicant: ASML NETHERLANDS B.V., Veldhoven (NL)

(72) Inventors: James Robert Downes, Eindhoven (NL); Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/527,264

(22) PCT Filed: Nov. 2, 2015

(86) PCT No.: PCT/EP2015/075388
§ 371 (c)(1),
(2) Date: May 16, 2017

(87) PCT Pub. No.: WO2016/087142
PCT Pub. Date: Jun. 9, 2016

(65) Prior Publication Data
US 2017/0261863 A1  Sep. 14, 2017

(30) Foreign Application Priority Data
Dec. 2, 2014 (EP) .................................... 14195783

(51) Int. Cl.
 G03B 27/42 (2006.01)
 G03F 7/20 (2006.01)
(52) U.S. Cl.
 CPC ............ *G03F 7/70425* (2013.01); *G03F 7/20* (2013.01); *G03F 7/706* (2013.01); *G03F 7/70491* (2013.01)

(58) Field of Classification Search
 CPC ...... G03F 7/706; G03F 7/70258; G03F 7/705; G03F 7/70625; G03F 7/70641;
 (Continued)

(56) References Cited

U.S. PATENT DOCUMENTS 6,784,977 B2  8/2004  Bunau et al.
7,262,831 B2  8/2007  Akhssay et al.
(Continued)

FOREIGN PATENT DOCUMENTS

CN  102768474  11/2012
JP  2003-124110  4/2003
(Continued)

OTHER PUBLICATIONS

Verhagen, Michel et al., "Chapter 10: The System-Identification Cycle", Filtering and System Identification: A Least Squares Approach, pp. 345-394 (2007).
(Continued)

*Primary Examiner* — Mesfin Asfaw
(74) *Attorney, Agent, or Firm* — Pillsbury Winthrop Shaw Pittman LLP

(57) ABSTRACT

A method of correcting aberrations caused by a projection system of a lithographic apparatus, the method including performing a measurement of an aberration caused by the projection system using a sensor located in the lithographic apparatus, determining, based on a history of operation of the lithographic apparatus since a change of machine state, whether to average the measured aberration with one or more aberration measurements previously obtained using the sensor, calculating a correction to be applied to the lithographic apparatus using the measured aberration if it is determined that averaging should not be performed, calculating a correction to be applied to the lithographic apparatus using an averaged aberration measurement if it is deter-
(Continued)

mined that averaging should be performed, and applying the calculated correction to the lithographic apparatus.

20 Claims, 6 Drawing Sheets

(58) Field of Classification Search
CPC .... G03F 7/70633; G03F 7/20; G03F 7/70141; G03F 7/70433; G03F 7/70308; H04N 5/23212; H04N 5/23209; H04N 5/217; H04N 5/2253; H04N 5/23229; G02B 27/0025; G02B 27/0068
See application file for complete search history.

(56) References Cited

U.S. PATENT DOCUMENTS

| | | | |
|---|---|---|---|
| 7,289,858 B2 | 10/2007 | Van Donkelaar et al. |
| 7,403,264 B2 | 7/2008 | Jeunink et al. |
| 7,421,358 B2 | 9/2008 | Tuohy |
| 7,580,113 B2 | 8/2009 | Tel et al. |
| 8,175,831 B2 | 5/2012 | Izikson et al. |
| 8,184,265 B2 | 5/2012 | Wardenier |
| 8,203,696 B2 | 6/2012 | Bittner et al. |
| 8,482,718 B2 | 7/2013 | Corbeij et al. |
| 8,741,510 B2 | 6/2014 | Takahashi et al. |
| 9,417,533 B2 | 8/2016 | Prosyentsov et al. |
| 9,513,564 B2 | 12/2016 | Ozawa |
| 2003/0002023 A1 | 1/2003 | Bunau et al. |
| 2005/0167514 A1 | 8/2005 | Kaushal et al. |
| 2005/0267609 A1 | 12/2005 | Van Donkelaar et al. |
| 2006/0008716 A1 | 1/2006 | Jeunink et al. |
| 2006/0114437 A1 | 6/2006 | Akhssay et al. |
| 2007/0177135 A1 | 8/2007 | Tuohy |
| 2007/0291243 A1 | 12/2007 | Suzuki |
| 2007/0296938 A1 | 12/2007 | Tel et al. |
| 2008/0286885 A1 | 11/2008 | Izikson et al. |
| 2009/0231568 A1 | 9/2009 | Fukuhara |
| 2009/0323039 A1 | 12/2009 | Wardenier |
| 2011/0043780 A1 | 2/2011 | Corbeij et al. |
| 2011/0181855 A1 | 7/2011 | Bittner et al. |
| 2012/0120379 A1 | 5/2012 | Phillips et al. |
| 2012/0133914 A1 | 5/2012 | Prosyentsov et al. |
| 2013/0060354 A1 | 3/2013 | Choi et al. |
| 2013/0137050 A1 | 5/2013 | Takahashi et al. |
| 2014/0204353 A1 | 7/2014 | Ozawa |

FOREIGN PATENT DOCUMENTS

| | | |
|---|---|---|
| JP | 2006-024941 | 1/2006 |
| JP | 2006-157020 | 6/2006 |
| JP | 2007-250723 | 9/2007 |
| JP | 2013-115348 | 6/2013 |

OTHER PUBLICATIONS

Verhagen, Michel et al., "Subspace model identification Part 1. The output-error state-space model identification class of algorithms", International Journal of Control, vol. 56, No. 5, pp. 1187-1210, 1992.

Van Overschee, Peter et al., "Chapter 4: Combined Deterministic-Stochastic Identification", Subspace Identification for Linear Systems, pp. 95-134 (1996).

Verhagen, Michel et al., "Chapter 5: Kalman Filtering", Filtering and System Identification: A Least Squares Approach, pp. 126-177 (2007).

Verhagen, Michel et al., "Chapter 8: Prediction-error Parametric Model Estimation", Filtering and System Identification: A Least Squares Approach, pp. 254-291 (2007).

Verhagen, Michel et al., "Chapter 9: Subspace Model Identification", Filtering and System Identification: A Least Squares Approach, pp. 292-344 (2007).

International Search Report and Written Opinion dated Feb. 25, 2016 in corresponding International Patent Application No. PCT/EP2015/075388.

El-Awady, Khalid et al., "Programmable thermal processing module for semiconductor substrates", IEEE Transactions on Control Systems Technology, vol. 12, No. 4, pp. 493-509 (2004).

Bikcora, Can et al., "Thermal Deformation Prediction in Reticles for Extreme Ultraviolet Lithography Based on a Measurement-Dependent Low-Order Model", IEEE Transactions on Semiconductor Manufacturing, vol. 27, No. 1, pp. 104-117 (Feb. 2014).

Notice of Reasons for Rejection issued for Japanese Patent Application No. 2017-526086, dated May 28, 2018.

LITHOGRAPHIC METHOD AND APPARATUS

CROSS-REFERENCE TO RELATED APPLICATIONS

This application is the U.S. national phase entry of PCT patent application no. PCT/EP2015/075388, which was filed on Nov. 2, 2015, which claims the benefit of priority of European patent application no. 14195783.7, which was filed on Dec. 2, 2014, and which is incorporated herein in its entirety by reference.

FIELD

The present invention relates to a lithographic method and apparatus, and particularly but not exclusively to a method of correcting aberrations caused by a projection system of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically by using a projection system to image the pattern onto a layer of radiation-sensitive material (resist) provided on the substrate. In general, a single substrate will contain a network of adjacent target portions that are successively patterned.

The projection system which is used to image the pattern onto the substrate will introduce some aberrations into the projected image.

It is an object of the invention to provide a method of correcting aberrations which obviates or mitigates a problem associated with the prior art.

SUMMARY

According to a first aspect of the invention there is provided a method of correcting aberrations caused by a projection system of a lithographic apparatus, the method comprising performing a measurement of aberrations caused by the projection system using a sensor located in the lithographic apparatus, determining, based on a history of operation of the lithographic apparatus since a change of machine state, whether to average the measured aberrations with aberration measurements previously obtained using the sensor, calculating a correction to be applied to the lithographic apparatus using the measured aberration if it is determined that averaging should not be performed, calculating a correction to be applied to the lithographic apparatus using an averaged aberration measurement if it is determined that averaging should be performed, and applying the calculated correction to the lithographic apparatus.

The method is advantageous because it allows averaging of aberration measurements to be used at times when averaged aberration measurements are useful (e.g. when aberrations are changing relatively slowly) and but does not average aberration measurements at times when averaged aberration measurements are less useful (e.g. when aberrations are changing relatively quickly).

The history of operation of the lithographic apparatus may comprise a number of substrates or lots of substrates exposed by the lithographic apparatus since a change of machine state of the lithographic apparatus.

It may be advantageous to use this approach if the change of machine state is for example a change of illumination mode and/or a change of mask.

The history of operation of the lithographic apparatus may comprise elapsed time since a change of machine state of the lithographic apparatus.

It may be advantageous to use this approach if the change of machine state is for example interruption of operation of the lithographic apparatus (e.g. switching off the lithographic apparatus then switching it on again at a later time).

The nature of the change of machine state may be taken into account when determining whether to average the measured aberrations with previously measured aberrations.

The nature of the change of machine state may be taken into account when determining the manner in which the averaged aberration measurement is calculated.

The change of machine state of the lithographic apparatus may comprise one or more of: an interruption of operation of the lithographic apparatus, a change of illumination mode, a change of mask, a change of lot size, or a change of radiation dose.

The method may comprise not performing averaging of measured aberrations if no aberration measurements have been performed since a change of machine state has occurred.

The averaged aberration measurement may be a rolling average of aberration measurements.

This is advantageous because over time aberration measurements which took place immediately after a change of machine state (when the aberrations may have been changing rapidly) are excluded from the average.

The averaged aberration measurement may be an average of all aberration measurements performed since the change of machine state occurred.

The method may further comprise ceasing to apply a correction calculated using aberration measurements performed using the sensor when a predetermined time has elapsed since the change of machine state.

This is advantageous because it allows automatic transfer to use of application process control (APC) corrections only.

The method may further comprise ceasing to apply a correction calculated using aberration measurements performed using the sensor when a predetermined number of substrates or lots of substrates has been exposed by the lithographic apparatus since the change of machine state.

The method may further comprise ceasing to apply a correction calculated using aberration measurements performed using the sensor when a rate of change of aberrations is slower than a predetermined threshold.

A weighting may be applied to the calculated correction, the weighting decreasing as the a number of substrates or lots of substrates exposed by the lithographic apparatus since the change of machine state increases, or as the elapsed time since the change of machine state increases.

A series of lots of substrates may be exposed, and the aberration measurement may be performed before exposure of each lot of substrates.

The rate at which aberration measurements are performed using the sensor may be adjusted based upon the history of operation of the lithographic apparatus since a change of machine state.

This may advantageously improve the throughput of the lithographic apparatus.

The calculation of the correction to be applied to the projection system may take into account feed-forward values based upon expected changes of the aberrations caused by the projection system.

A computer program comprising computer readable instructions may be configured to cause a computer to carry out a method according to the above aspect of the invention.

According to an aspect of the invention there is provided a computer readable medium carrying a computer program according to the above.

According to an aspect of the invention there is provided a lithographic apparatus comprising a projection system, a sensor configured to measure aberrations, and a controller, wherein the controller is configured to use the sensor to perform a measurement of aberrations caused by the projection system, determine, based on a history of operation of the lithographic apparatus since a change of machine state, whether to average the measured aberrations with aberration measurements previously obtained using the sensor, calculate a correction to be applied to the lithographic apparatus using the measured aberration if it is determined that averaging should not be performed, calculate a correction to be applied to the lithographic apparatus using an averaged aberration measurement if it is determined that averaging should be performed, and apply the calculated correction to the lithographic apparatus.

The history of operation of the lithographic apparatus may comprise a number of substrates or lots of substrates exposed by the lithographic apparatus since a change of machine state of the lithographic apparatus.

The history of operation of the lithographic apparatus may comprise elapsed time since a change of machine state of the lithographic apparatus.

The controller may take into account the nature of the change of machine state when determining whether to average the measured aberrations with previously measured aberrations.

The controller may take into account the nature of the change of machine state when determining the manner in which the averaged aberration measurement is calculated.

The change of machine state of the lithographic apparatus may comprise one or more of: an interruption of operation of the lithographic apparatus, a change of illumination mode, a change of mask, a change of lot size, or a change of radiation dose.

If no aberration measurements have been performed since a change of machine state has occurred then the controller may not perform averaging of measured aberrations.

The averaged aberration measurement may be a rolling average of aberration measurements.

The averaged aberration measurement may be an average of all aberration measurements performed since the change of machine state occurred.

The controller may cease to apply a correction calculated using aberration measurements performed using the sensor when a predetermined time has elapsed since the change of machine state.

The controller may cease to apply a correction calculated using aberration measurements performed using the sensor when a predetermined number of substrates or lots of substrates has been exposed by the lithographic apparatus since the change of machine state.

The controller may cease to apply a correction calculated using aberration measurements performed using the sensor when a rate of change of aberrations is slower than a predetermined threshold.

The controller may apply a weighting to the calculated correction, the weighting decreasing as the a number of substrates or lots of substrates exposed by the lithographic apparatus since the change of machine state increases, or as the elapsed time since the change of machine state increases.

The controller may adjust the rate at which aberration measurements are performed using the sensor based upon the history of operation of the lithographic apparatus since a change of machine state.

The calculation by the controller of the correction to be applied to the projection system may take into account feed-forward values based upon expected changes of the aberrations caused by the projection system.

The lithographic apparatus may include a user interface and the controller is configured to receive via the user interface one or more parameters to be used by the controller to determine whether to calculate a correction to be applied to the lithographic apparatus using an averaged aberration measurement.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
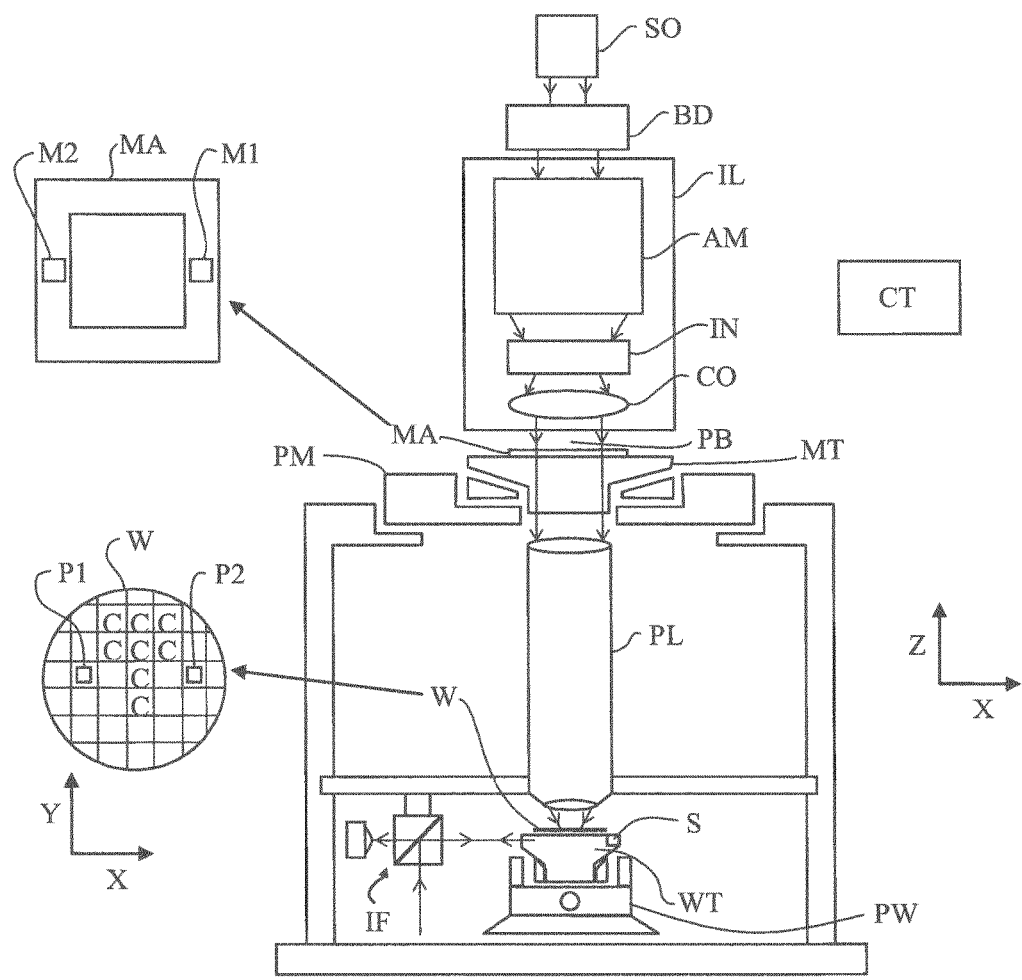
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:
an illumination system IL to condition a beam PB of radiation (e.g. UV radiation).
a support structure (e.g. a mask table) MT to support a patterning device (e.g. a mask) MA and connected to first positioning device PM to accurately position the patterning device with respect to item PL;
a substrate table (e.g. a substrate table) WT for holding a substrate (e.g. a resist coated wafer) W and connected to second positioning device PW for accurately positioning the substrate with respect to item PL; and
a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a reflective mask or programmable mirror array of a type as referred to above).

The illumination system IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising for example suitable directing mirrors and/or a beam expander. In other cases the source may be integral part of the apparatus, for example when the source is a mercury lamp. The source SO and the illumination system IL, together with the beam delivery system BD if required, may be referred to as a radiation system.

The illumination system IL may comprise adjusting means AM for adjusting the angular intensity distribution of the beam. The outer and/or inner radial extent (commonly referred to as σ-outer and σ-inner, respectively) of the intensity distribution in a pupil plane of the illumination system can be adjusted. The adjusting means may also be capable of selecting different forms of illumination mode, such as for example a dipole mode or a quadrupole mode. Different forms of illumination mode may be used to project different mask patterns.

In addition, the illumination system IL generally comprises various other components, such as an integrator IN and a condenser CO. The illumination system provides a conditioned beam of radiation PB, having a desired uniformity and intensity distribution in its cross section. The angular intensity distribution of the radiation beam PB will depend upon the illumination mode that has been selected by the adjusting means AM.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. Patterning device MA and substrate W may be aligned using patterning device alignment marks M1, M2 and substrate alignment marks P1, P2. In an alternative arrangement (not illustrated) movement of the object tables MT, WT may be controlled by a planar motor and encoder system.

The depicted apparatus may for example be used in a scan mode, in which the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion. The scanning direction is conventionally referred to as the y-direction of the lithographic apparatus.

A sensor S is provided on the substrate table WT of the lithographic apparatus. The sensor S is configured to measure aberrations in the radiation beam projected by the projection system PL. The sensor S may for example comprise an imaging array (e.g. a CCD array). A diffraction grating (not shown) is provided either on the mask MA or on the mask table MT. In order to perform a measurement of the aberrations caused by the projection system PL, the mask table MT is moved such that the radiation beam PB illuminates the diffraction grating. The projection system PL forms an image of the diffraction grating at the substrate table WT. The sensor S is positioned beneath the projection system PL to capture the image of the diffraction grating. A series of diffraction grating images are captured at different positions relative to the focal plane (i.e. different z-direction positions using the Cartesian coordinates shown in FIG. 1). The images are analysed to provide measurements of the aberrations which have been introduced into the radiation beam PB by the projection system PL. The aberrations may for example be expressed as a set of Zernikes. A set of measurements may be performed with the diffraction grating and sensor S at different x-direction positions along an area which is illuminated by the radiation beam PB (the illuminated area may be referred to an exposure slit). Alternatively, the sensor S may comprise an imaging array (e.g. CCD array) which is sufficiently large to capture an image along the entire x-direction extent of the exposure slit. Where this is the case a set of diffraction gratings may be provided at mask level, the diffraction gratings being spaced apart along the x-direction of the exposure slit. Aberration measurements are then determined for each diffraction grating of the set. In an embodiment the set of diffraction gratings may comprise seven diffraction gratings, and thus aberration measurements may be provided at seven positions spaced apart along the x-direction of the exposure slit. In some instances images may be captured away from a central line which bisects the exposure slit (which may correspond with y=0) and are used to provide aberration measurements.

A controller CT is configured to adjust lenses of the projection system PL in order to correct the aberrations caused by the projection system PL. The controller CT may for example comprise a microprocessor. Several of the lenses of the projection system PL may be provided with manipulators which are configured to modify the shape, position and/or orientation of those lenses. The lens manipulators may for example be mechanical actuators which apply compressive or stretching force to edges of a lens, or may for example be heaters which are configured to selectively heat parts of a lens. The effect of modifying the lens shapes, positions and orientations using the manipulators is well-known and thus the lens manipulators can be used to correct the aberration introduced by the projection system PL in a known way. The sensor S, controller CT and lens manipulators thus comprise a feedback loop which is used to measure aberrations and to correct measured aberrations. In one example, the sensor S and controller CT determine that a Z9 offset is present. This may be reduced by introducing a linear combination of manipulator adjustments which introduce the opposite Z9 offset. The linear combination of manipulator adjustments is determined by optimizing a merit function (typically a sum of squares of the measured aberrations) by treating the various lens manipulators as the degrees of freedom. If a is a vector containing all manipulator positions and z is a vector containing all the aberrations measured at the different positions in the exposure slit, then the aberrations resulting after a lens adjustment will be $z'=z-L \cdot a$ where L is a matrix containing the 'lens dependencies' (the lens dependencies being a description of the aberrations introduced by each manipulator). A simple example of a solution is the least-squares solution, where z' is minimized treating the vector a as the variable parameter set, giving $a\_min=(L \cdot L^T)^{(-1)} \cdot L^T \cdot z$. Solutions other than a least-squares solution may be used.

The controller CT may also be configured to adjust the positions of the mask MA and/or substrate W to correct aberrations caused by the projection system PL. A simple form of aberration is lateral displacement of an image. The controller may correct for such lateral displacement by adjusting the position of the mask MA and/or substrate W.

The controller CT may also be configured to adjust the wavelength of the radiation beam PB to correct aberrations caused by the projection system PL. A simple form of aberration is displacement of an image above or below the focal plane. This may be corrected for by adjusting the wavelength of the radiation beam PB provided by the source SO.

The feedback loop may thus be used to correct aberrations introduced by the projection system PL. It may not be possible to entirely remove all aberrations introduced by the projection system PL. However, reduction of the aberrations such that they fall below thresholds may be sufficient to allow projection of a pattern onto substrates with a desired accuracy using the projection system PL. References to correction of aberrations is not intended to mean that aberrations are entirely eliminated (this would be impractical). Instead, aberration correction may be interpreted as meaning a projection system adjustment which reduces (or is intended to reduce) aberrations caused by the projection system.

In some embodiments, performing aberration measurements using the sensor S may require a significant amount time, for example around 10 seconds. The lithographic apparatus may pattern an entire substrate in around 30 seconds, and thus the period required to measure aberrations is significant compared with the period required to pattern a substrate. For this reason, the aberration measurement may be performed after a plurality of substrates has been patterned. For example, the aberration measurement may be performed each time a lot of substrates has been patterned (a lot of substrates may, for example, be between 10 and 30 substrates, e.g. 25 substrates).

In an embodiment in which the sensor S extends fully along the exposure slit, the aberration measurement may be performed more quickly, for example within less than 1 second. This is because there is no requirement to move between different x-direction positions of the grating and sensor in order to measure aberration across the exposure slit. In this case the aberration measurement may be performed more often, for example after each substrate has been patterned. The aberration measurement may alternatively be performed after each lot of substrates has been patterned.

The aberration measurement performed using the sensor will include some error. Sources of the error may include limited resolution of the imaging array of the sensor and noise present in the measured image. One way in which the error in the measured aberrations may be reduced is by repeating the aberration measurement performed by the sensor. However, since performing the aberration measurement requires a significant period of time, it may be preferred not to repeat the measurement. In some instances, the error in the aberration measurement may be so large that adjusting the lenses of the projection system PL to correct for apparent aberrations will in fact reduce the accuracy with which patterns are projected onto the substrate. In other words, the aberrations which are caused by the projection system PL are increased, or at least aberrations which have a significant impact upon the projected pattern are increased such that the accuracy of the projected pattern is reduced.

Figure 2:
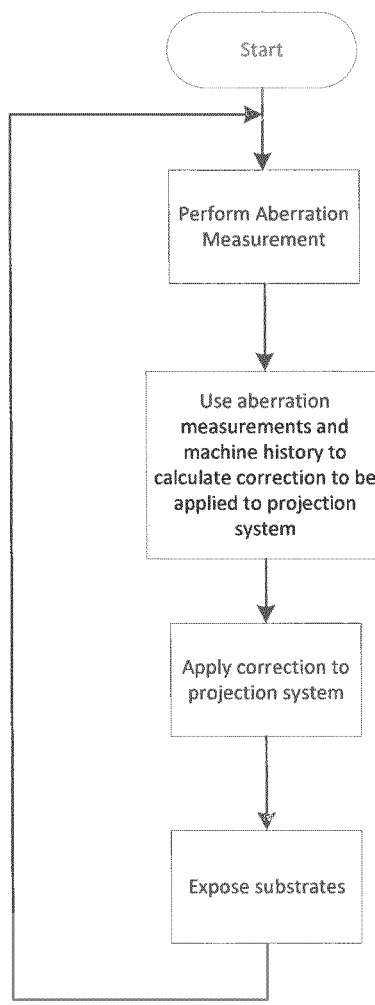
FIG. 2 depicts a method of aberration correction according to an embodiment of the invention.

FIG. 2 schematically represents a method which may be used to overcome or mitigate the above problem. The method may be controlled by the controller CT. Calculations which form part of the method may be performed by the controller CT. The method comprises measuring aberrations introduced by the projection system, using the measured aberrations and the history of operation of the lithographic apparatus to calculate a projection lens correction, applying the correction to the projection system P, then exposing substrates. The method is repeated periodically, for example each time a lot of substrates has been exposed.

Figure 3:
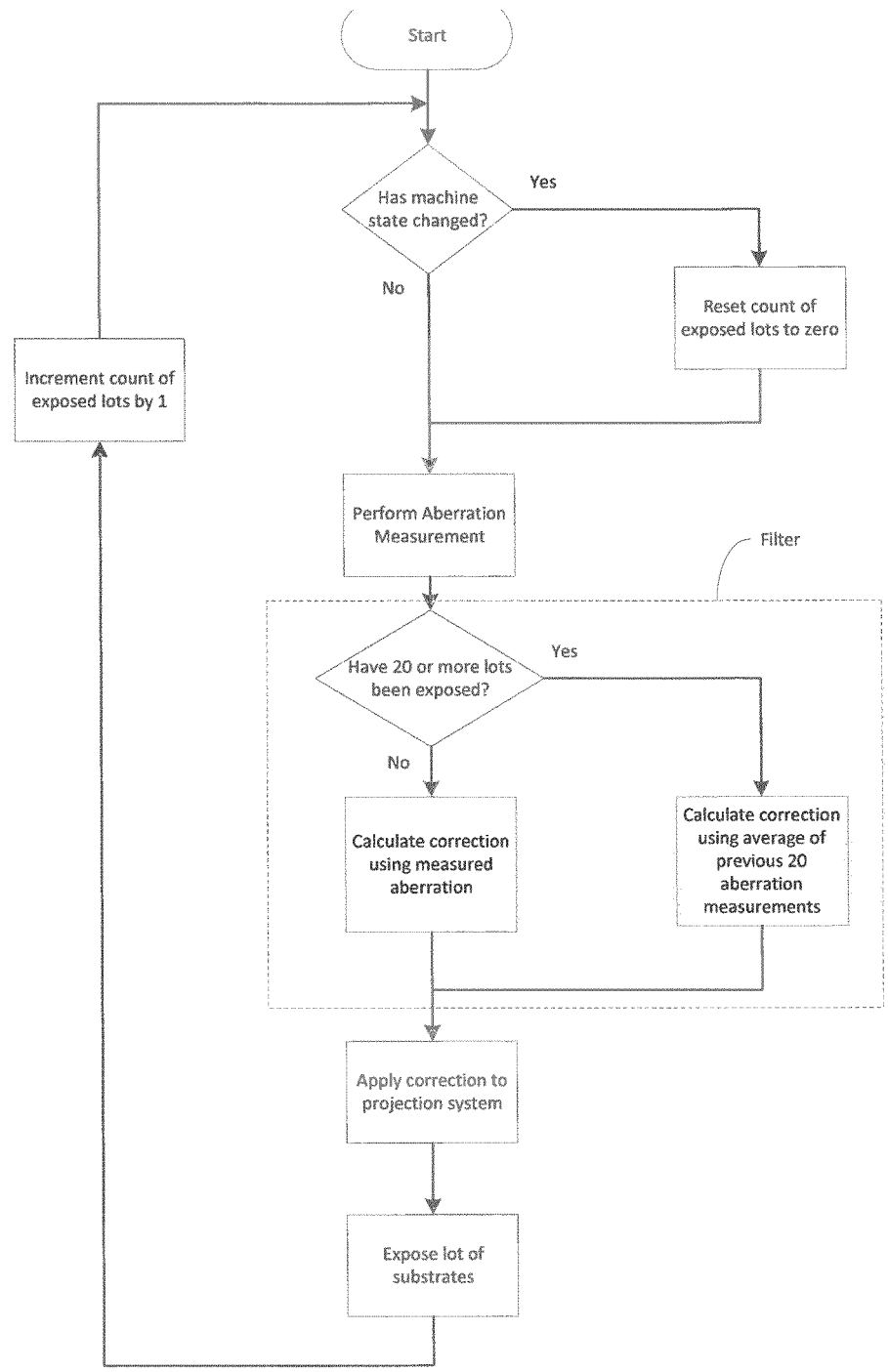
FIG. 3 depicts a method of aberration correction according to an embodiment of the invention in more detail.

An embodiment of the invention is represented schematically in FIG. 3. The first step of the method shown in FIG. 3 is determining whether the lithographic apparatus has undergone a change of machine state. The controller CT receives inputs which indicate that a change of machine state has occurred. The inputs may also identify the form of the change of machine state. The fact that the change of machine state occurred is an example of the history of operation of the lithographic apparatus (the nature of the change of machine state is also an example of the history of operation of the lithographic apparatus). In one example the change of machine state may be stopping operation of the lithographic apparatus to allow for routine maintenance, followed by restarting of the lithographic apparatus. In another example a change of machine state may be interruption of operation of the lithographic apparatus due to a delay somewhere else in a production line (often referred to as a track) of which the lithographic apparatus is one part. Such a delay may be referred to as a track delay. A track delay may for example occur because a tool used to prepare the substrates for patterning has stopped operating. When the lithographic apparatus stops operating the projection system will start to cool down because the radiation beam is no longer passing through it. This will change the aberrations caused by the projection system. The aberrations will change again as the projection system heats up when patterning of substrates is resumed.

In another example the change of machine state may be a change of form of the illumination mode used by the lithographic apparatus (e.g. from an annular mode to a dipole mode). This may occur when a mask MA is exchanged for a mask provided with a different pattern. When a change of form of the illumination mode occurs the radiation beam will pass through different locations in some lenses of the projection system. This will cause localised heating which may introduce aberrations into the radiation beam.

In another example the change of machine state may be an adjustment of the illumination mode (e.g. changing its outer diameter) without changing its form. This may occur when a mask MA is exchanged for a mask provided with a different pattern. A change such this changes the effective numerical aperture, and this may have a significant effect upon higher order aberrations caused by the projection system (e.g. aberrations of the $5^{th}$ order or higher).

A change of the form of the illumination mode and an adjustment of the illumination mode may both be considered to be examples of changes of the illumination mode.

In another example the change of machine state may be exchange of a mask MA for a mask provided with a different pattern, without a change of the illumination mode. The new mask will diffract the radiation beam in a different manner from the old mask, causing the radiation to pass through different locations in some lenses of the projection system.

In another example the change of machine state may be a change of the radiation dose that is provided to the substrate. This will alter heating of the projection system. For example, if the radiation dose is increased then heating of the projection system caused by the radiation beam will also increase. In practice, a change of radiation dose is most likely to occur when a change of mask occurs (which may be accompanied by a change of illumination mode).

In another example the change of machine state may be a change of the number of substrates which comprise a substrate lot. This affections projection system aberrations because the overall duty cycle of the projection lens changes. When exposure of the last substrate of a lot has occurred there is a delay before exposure of the first substrate of the next lot takes place. During this delay the radiation beam is not passing through the projection system and so heating of the projection system is interrupted. The frequency at which the delay occurs depends upon the size of the lots being exposed, and will change when the lots size changes. Thus, changing the lot size will change heating of the projection system and will modify aberrations introduced into the radiation beam by the projection system.

In general, the change of machine state may be interruption of operation of the lithographic apparatus, or a change of any operating parameter of the lithographic apparatus which will have a significant effect upon aberrations introduced into the radiation beam by the projection system. Operating parameters include illumination mode form, illumination mode inner diameter, illumination mode outer diameter, lot size, radiation dose, or a change of mask. The occurrence of the change of machine state and the nature of the change of the machine state are examples of the history of operation of the lithographic apparatus.

If a change of machine state has occurred then a count of the number of exposed lots of substrates is reset to zero before moving to the next step, which is an aberration measurement. If a change of machine state has not occurred then the method proceeds directly to the aberration measurement. In the following description of the method of FIG. 3 it is assumed that a change of machine state has just occurred.

In the next step of the method a measurement of the aberration caused by the projection system PL is performed using the sensor S, and the results of the measurement are passed to the controller CT.

The controller CT checks whether 20 or more lots of substrates have been exposed since the change of machine state. Since a change of machine state has just occurred, no lots of substrates have been exposed since that change of machine state. Consequently, the controller calculates correction of the projection system PL using the aberration measurement that has just been performed.

The controller CT applies the calculated correction to the projection system PL. A lot of substrates is then exposed. The count of lots of exposed substrates is incremented by 1, and the method returns to the beginning of the steps shown in FIG. 3.

On the second pass through the method a change of machine state has not occurred and the method proceeds directly to the aberration measurement without resetting the count of exposed lots (the number of exposed lots is 1). The aberration caused by the projection system PL is measured using the sensor S, and the results of the measurement are passed to the controller CT.

Since only one lot of substrates has been exposed, the controller again calculates correction of the projection system using the aberration measurement that has just been performed. The controller CT then applies the calculated correction to the projection system PL, following which a lot of substrates is then exposed. The count of exposed lots is incremented by 1, and the method returns to the beginning of the steps shown in FIG. 3.

The above steps are repeated until 20 lots of substrates have been exposed. When this is the case, following the aberration measurement the controller CT does not calculate the correction using the aberration measurement that has just been performed, but instead calculates the correction using an average of the previous 20 aberration measurements. The calculated correction is then applied to the projection system, following which another lot of substrates is exposed.

The method then continues for subsequent lots, and after each aberration measurement an average of the previous 20 aberration measurements is used to calculate the correction which is applied to the projection system. Thus, a rolling average of the last 20 aberration measurements is used to calculate the correction which is applied to the lenses of the projection system. For example, when 25 lots have been exposed an average of aberration measurements performed for lots 6 to 25 will be used to calculate the correction.

The rolling average of the last 20 aberration measurements will continue to be used to calculate the correction until a change of machine state occurs. When the change of machine state occurs the count of exposed lots is reset to zero and the correction is once again based on the aberration measurement that has just been performed. This continues to be the case until 20 lots have been exposed, whereupon the correction is once again calculated using a rolling average of the last 20 aberration measurements.

Introducing a rolling average after exposure of 20 lots of substrates is merely an example. A rolling average (or other average) may be introduced after some other number of exposed lots of substrates, for example 10 lots, 30 lots, or any other suitable number of lots. Similarly, any number of aberration measurements may be used to generate an averaged measurement.

The embodiment of FIG. 3 is advantageous because it provides correction on a per-lot basis of aberrations at a time when the aberrations can be expected to change on a timescale similar to the time required to expose a lot of substrates (i.e. after a change of machine state). The embodiment then provides averaged aberration corrections at a time when the aberrations can be expected to change more slowly (i.e. once a plurality of lots have been exposed following the change of machine state, when slow drift of aberrations may be expected). The use of a rolling average is advantageous because aberration measurements performed soon after the change of machine state occurred will over time cease to form part of the average and instead only aberration measurements performed with the lithographic apparatus in a steady state will be used. When an average is being used, an error associated with a particular aberration measurement will be averaged out and will have a reduced effect upon the correction applied to the projection system (the averaging improves the signal to noise ratio of the measured aberration).

Figure 4:
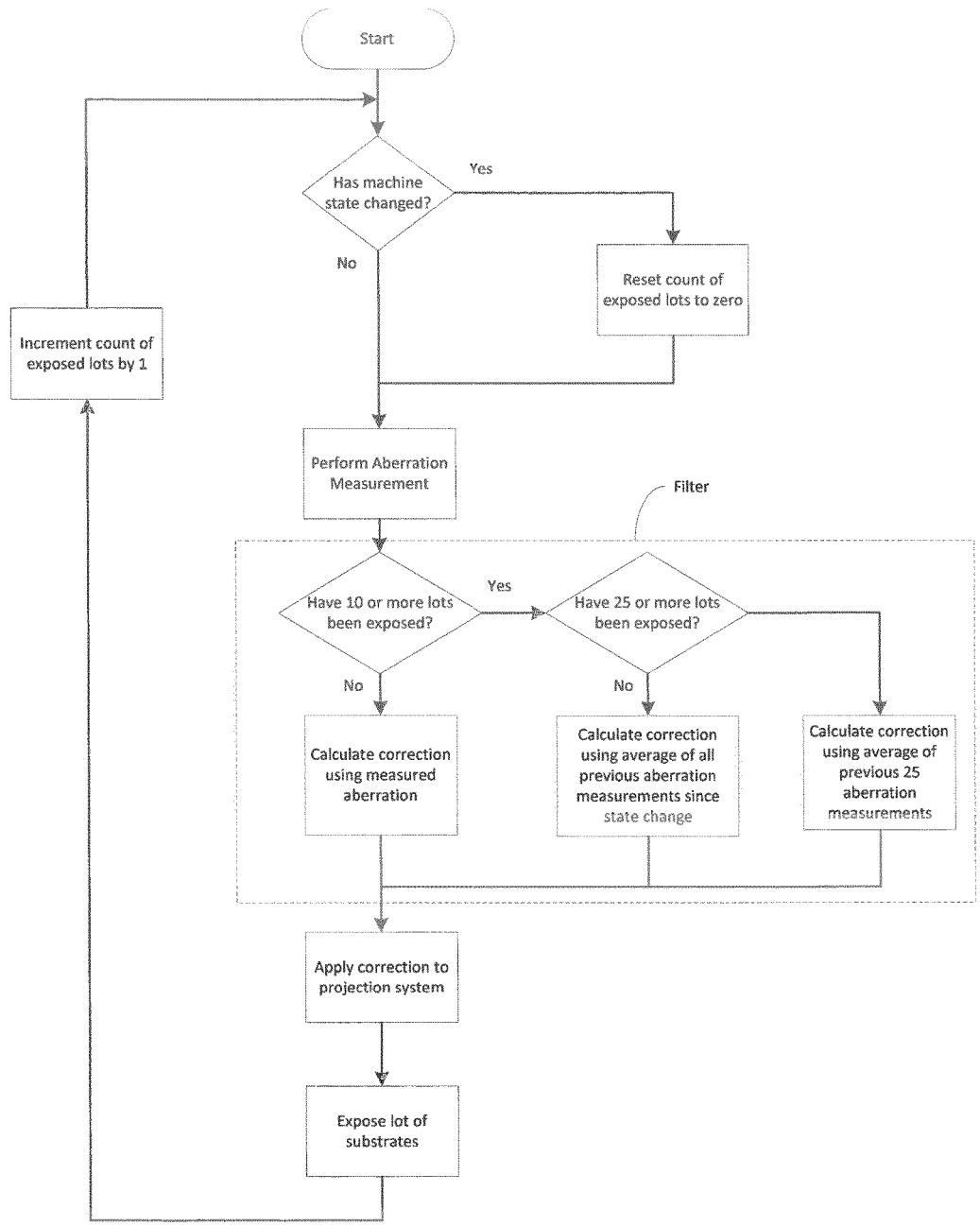
FIG. 4 depicts a method of aberration correction according to an alternative embodiment of the invention.

In an embodiment, averaging of the aberration measurements may be phased in over time. A method which uses this approach is set out in FIG. 4. Referring to FIG. 4, a change of machine state occurs, which may for example be introduction of a new mask MA into the lithographic apparatus and a change of illumination mode used to illuminate that mask. The count of exposed lots is reset to zero.

The aberration introduced by the projected system PL is measured using the sensor S. The controller determines whether 10 lots have been exposed since the change of machine state. In this instance 10 lots have not been exposed, and thus the controller moves to the next step which is calculation of the projection system correction using the aberration measurement that has just been performed. The correction is applied to the projection system PL and a lot of substrates is then exposed.

Following exposure of the lot of substrates the count of exposed lots is incremented by 1. The aberration is again measured. Since 10 aberration measurements have not yet been performed, the controller again moves to the step of calculating the aberration correction using the aberration that has just been measured. The correction is applied and the lot of substrates is exposed. This process is repeated until the $10^{th}$ lot of substrates has been exposed.

When the controller CT determines that 10 lots of substrates have been exposed, the method moves along the right-hand branch of the flow chart. The controller then checks whether 25 lots of substrates have been exposed. Since only 10 lots of substrates have been exposed, the answer to this question is no and the controller then moves down to the method step of averaging using all aberration measurements which have been performed since the change of machine state. The averaged aberration measurement is used to calculate a correction to be applied to the projection system PL. The correction is then applied and a lot of substrates is exposed.

The method is then repeated, and in each case all of the preceding aberration measurements since the change of machine state are used to determine the correction to be applied to the projection system PL. This continues until 25 lots have been exposed. At this point the number of aberration measurements which is used to calculate the average aberration is fixed at 25. The average aberration is used to calculate a correction which is applied to the projection system PL. A lot of substrates is then exposed. Following this a rolling average which uses the most recent 25 aberration measurements is used to calculate all average aberration measurements until there is a change of machine state. When the change of machine state occurs, then the method returns to calculating the correction based on the aberration measurement that has just been performed.

The values used in the method shown in FIG. 4 are merely example values. Any suitable values may be used. The embodiment of FIG. 4 is advantageous because it provides correction on a per-lot basis of aberrations at a time when the aberrations are changing relatively quickly (i.e. after a change of machine state), that then provides averaged aberration corrections when the aberrations are changing less quickly (i.e. once several lots have been exposed following the change of machine state). Finally, the method provides a rolling average of the aberration at a time when the lithographic apparatus is operating in a steady state. When the lithographic apparatus is operating in a steady state, the aberrations caused by the lens system will change more slowly than they change immediately after the change of machine state (the aberrations may drift over time). Averaging over the last 25 aberration measurements reduces the likelihood of an aberration measurement with an error adjusting the projection system such that the accuracy of projected patterns is reduced instead of increased.

Figure 6:
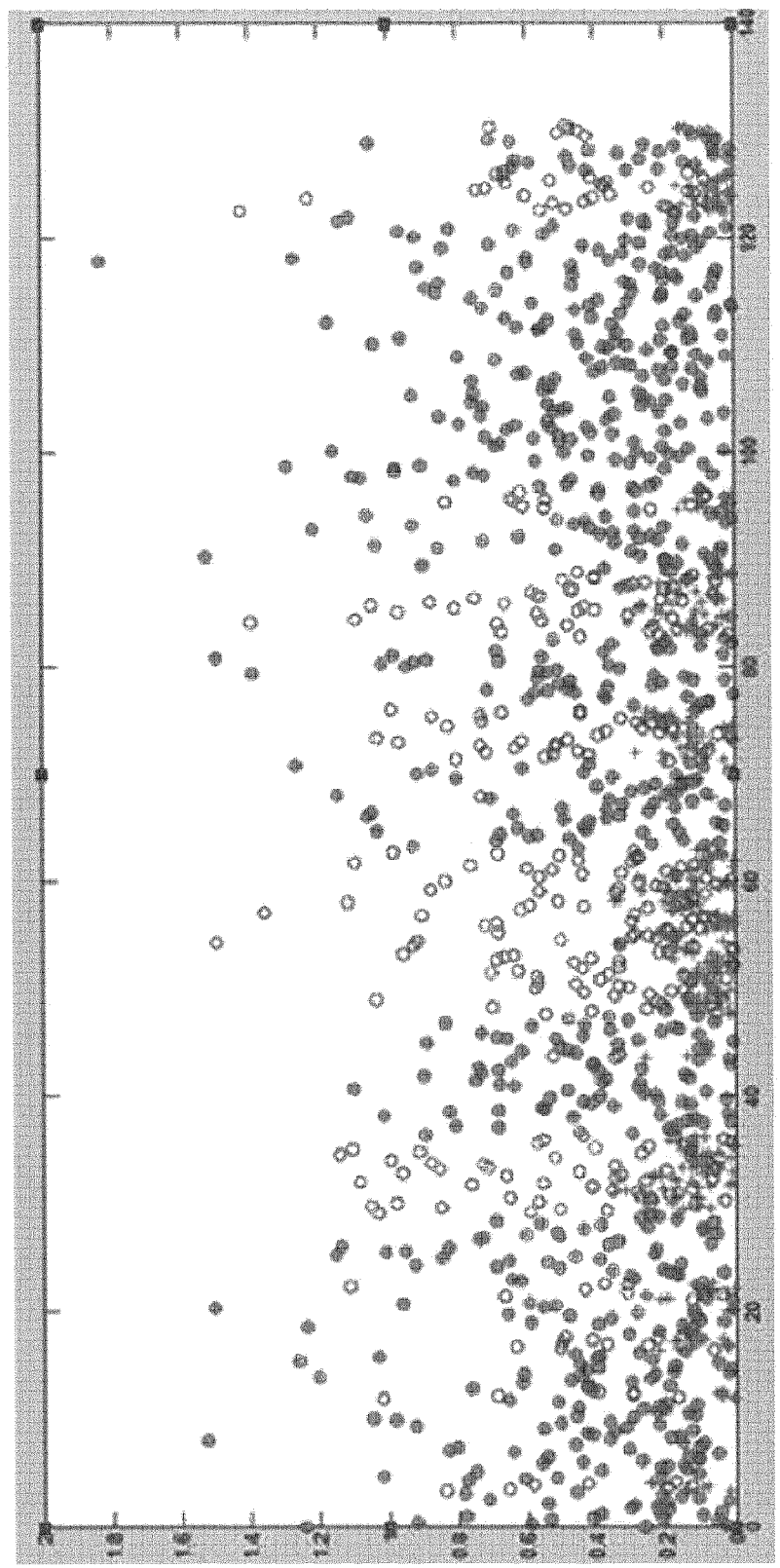
FIG. 6 depicts results obtained using a simulation of an embodiment of the invention.

A simulation of a method according to an embodiment of the invention has been run, the results of which are shown in FIG. 6. The simulation used a model of the aberration behaviour of a lithographic apparatus projection system to show the effect of the invention. In FIG. 6 the horizontal axis indicates the number of lots of substrates which have been exposed. The vertical axis indicates aberration caused by the projection system (expressed as a generic value). The aberration is shown in terms of absolute values for simplicity of illustration. The simulation used three different simulated masks, each having an associated illumination mode with different properties. The simulation used three different lot sizes: 1 substrate, 25 substrates and 50 substrates, with the 25 substrate lot size being significantly more common than the other lot sizes. A mix of the three different masks and lot sizes was generated. No delays in operation of the simulated lithographic apparatus, such as a track delay, were included in the simulation. The reproducibility of aberration measurements made by a simulated sensor of the simulated lithographic apparatus was set to 0.5 (1-sigma normal distribution). The simulated output of the sensor was thus a combination of a (correct) aberration measurement and a randomly generated error.

Figure 5:
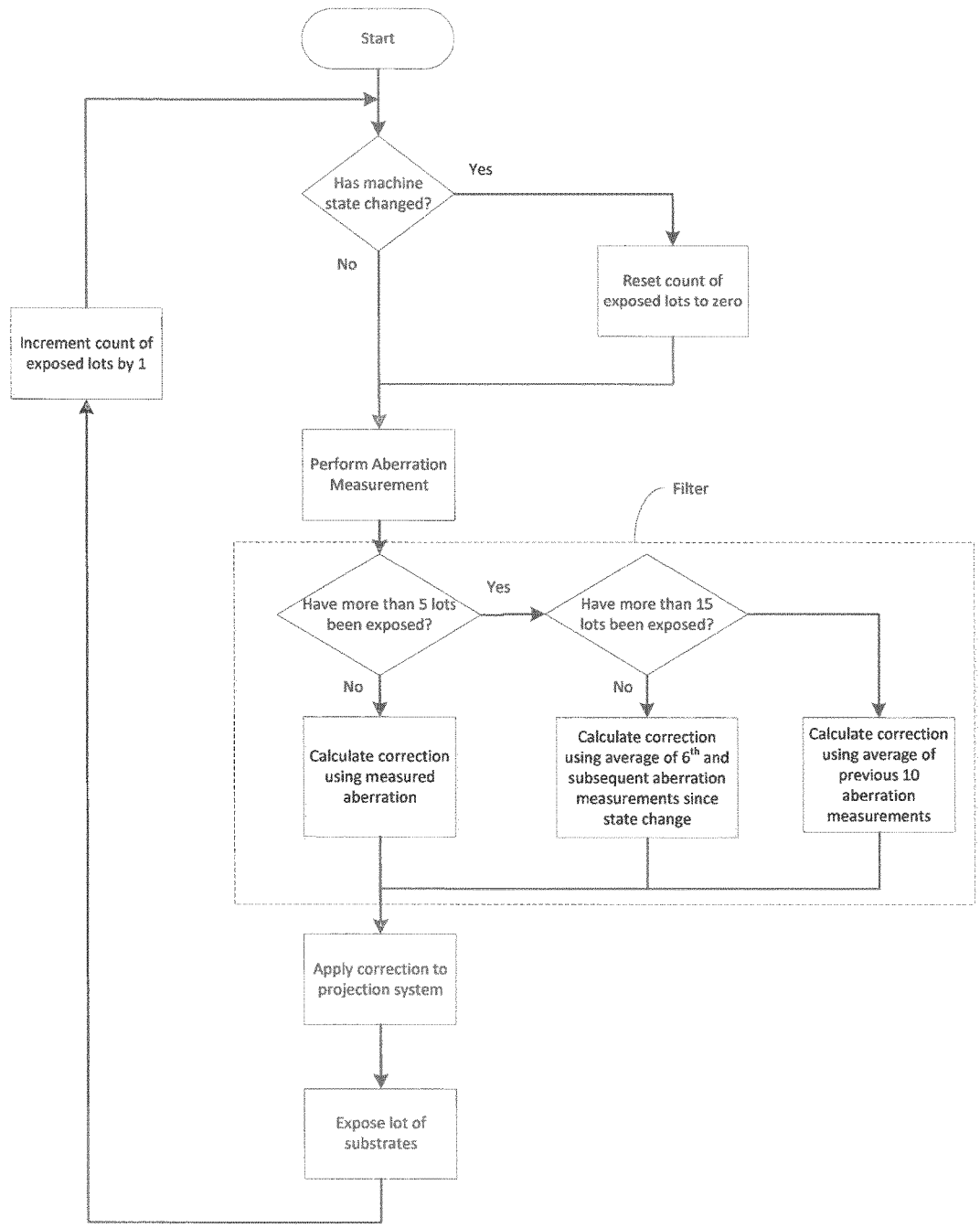
FIG. 5 depicts a method of aberration correction according to an alternative embodiment of the invention.

The method used in the simulation is shown in FIG. 5. In the method no averaging of aberration measurements is performed when calculating the aberration correction before exposure of the first 5 lots. When the 6$^{th}$ lot is to be exposed averaging of the aberration measurement is enabled, but only using the 6$^{th}$ and subsequent aberration measurements (thus in practice no averaging takes place). When the 7$^{th}$ lot is to be exposed an average of the 6$^{th}$ and 7$^{th}$ aberration measurements is generated and used to calculate the correction. When the 8$^{th}$ lot is to be exposed the average is an average of the 6$^{th}$, 7$^{th}$ and 8$^{th}$ aberration measurements. This continues until more than 15 lots have been exposed. At this point the averaging uses a rolling average of the previous 10 aberration measurements. Thus, aberration measurements for lots 6 through to 15 are used, followed by aberration measurements for lots 7 through to 16, etc. This continues until a change of machine state occurs.

The hollow circles in FIG. 6 indicate aberration values generated when the projection lens aberration was measured and corrected for after each lot without using averaging (i.e. without using the invention). The crosses indicate aberration values generated when averaging was used (i.e. using the invention). The shaded circles indicate aberration values generated when the invention was used but averaging of aberration measurements was not triggered. That is, averaging was not performed because the history of operation of the lithographic apparatus was such that averaging was not expected to improve the aberration correction (less than 5 lots had been exposed since a change of machine state). As a result, the aberration values generated are the same irrespective of whether or not the invention is being used (as indicated by the shaded circles).

For a given lot, the aberration value obtained using an averaged measurement as indicated by a cross can be compared with the aberration value obtained without using averaging as indicated by a hollow circle. In general the crosses are much closer to the bottom of the vertical axis than the hollow circles, and thus it can be seen that the invention provides improved aberration correction. There may be instances of specific lots where the invention provides a worsened aberration correction, i.e. the cross is further from the vertical axis than the circle for that lot. However, these instances are relatively few. The average error when no averaging is used has been calculated at 0.41, whereas the average error when the invention is used has been calculated at 0.31. As may be seen from FIG. 6, the averaging provides clusters of aberration values which are very low, for example around 120 lots, indicating particularly good performance provided by averaging. No equivalent clusters are seen when averaging is not being used.

Modelling such as that used to generate the results shown in FIG. 6 may be used to determine values for use by the method, based upon the known aberration behaviour of a given projection system. The modelling may also take into account expected conditions in a wafer production environment.

In an embodiment, instead of introducing averaging of aberration measurements after exposure of particular number of lots or substrates, averaging may be introduced after a particular period of time has elapsed since a change of machine state. The rolling average (or other average) need not necessarily be on the basis of a particular number of lots, but may instead be based on some other parameter such as, for example, being based upon exposure of a number of substrates. The rolling average (or other average) may be based on aberration measurements obtained during a particular preceding period of time.

The number of exposed lots since a change of machine state, number of exposed substrates since a change of machine state, and period of time since a change of machine state are all examples of a parameter that may be monitored to determine when averaging of aberration measurements should be introduced. They are all examples of a parameter that may be used to determine how averaging of aberration measurements should be performed. Other parameters, such as for example lens temperature, may be used. Values of these parameters may be considered to form part of the history of operation of the lithographic apparatus.

In general, the controller CT may selectively use an averaged aberration measurement to calculate a correction to the projection system, the selection being based on a monitored parameter since a change of machine state (e.g. the number of substrate exposures that have been performed (or the number of lots of substrates that have been exposed). The average may for example be a rolling average of a plurality of previously performed aberration measurements.

A subset of previously performed aberration measurements may be used to generate an averaged aberration measurement. The subset may comprise a continuous series of previously performed aberration measurements. Alternatively, the subset may comprise a discontinuous series of previously performed aberration measurements. For example, alternate substrate lots may be exposed by the lithographic apparatus using mask A and mask B. Where this is the case, an averaged aberration measurement generated for substrate exposure using mask A may include aberration measurements obtained when exposing a previous lot using mask A (i.e. aberration measurements obtained before a lot of substrates was exposed using mask B). In general, characteristics of previous exposures (e.g. exposures of previous lots) may be used when selecting aberration measurements to be used to generate an averaged aberration measurement. Averaging may be limited to using aberration measurements obtained during exposure of previous lots (or substrates) which have the same characteristics.

The lithographic apparatus may cease operation for several days, for example to allow repair of the lithographic apparatus. Where this is the case, the projection system PL will cool down. The projection system comprises a series of refractive lenses held in a thick-walled metal cylinder. The projection system may have a large heat capacity and may radiate heat slowly such that it takes around two days for the projection system to cool down to the ambient temperature. When the lithographic apparatus begins operation once more, the projection system will slowly heat up, for example over a period of several hours or even over a day or two. During this heating of the projection system a characteristic aberration (e.g. a third order aberration) is likely to be seen, the aberration drifting over time as the projection system warms up to a stable operating temperature. Embodiments of the invention may correct this aberration. Since the aberration varies relatively slowly, correction of the aberration using an averaged aberration measurement (e.g. an average of 25 aberration measurements) provides correction of the aberration whilst reducing the likelihood that noise in an aberration measurement causes projected pattern accuracy to be reduced (the noise will be averaged out).

Embodiments of the invention may take into account the nature of a change of machine state. Where this is the case, the manner in which averaging of the aberration measurement is introduced may be adjusted accordingly. For example, if the outer diameter of the illumination mode is changed then this may be expected to change higher order aberrations of the projection lens. These may be expected to stabilise over a time period of minutes to hours. This is much shorter than the time period taken for a characteristic aberration (e.g. third order aberration) to stabilise following maintenance of the lithographic apparatus. Thus, for example the number of substrate exposures (or lot exposures) needed before averaging is initiated may be selected accordingly (e.g. more substrate exposures before averaging is used if more slowly varying aberrations are expected). The number of aberration measurements which are used to generate the averaged aberration measurement may also take into account the nature of the change of machine state.

Another example of taking into account the nature of the change of machine state relates to lot size. In this example many lots of the same type are exposed and over time averaging of the aberration measurements moves to a steady state (e.g. rolling average). A single lot with the same image but fewer substrates is then exposed. For that single lot averaging may be discontinued or weighted towards aberration measurements performed for that lot. Subsequent exposures may return to the original lot size using the same image. Where this is the case the averaging which is performed may return to the steady state of averaging (e.g. rolling average) more quickly than was the case following exposure of the first lot of the many lots.

In another example, aberration changes caused by a short interruption of the operation of the lithographic apparatus (e.g. a few seconds due to a track delay) may be expected to stabilize relatively quickly when exposing many lots of the same type (i.e. same pattern and same lot size). Aberration changes caused by a change of the form of the illumination mode may be expected to stabilize more slowly. The number of substrate exposures (or lot exposures) needed before averaging is initiated may be selected accordingly. Similarly, the number of aberration measurements which are used to generate the averaged aberration measurement may be selected accordingly.

In another example, if the change of machine state is switching off the lithographic apparatus for maintenance then the parameter used by the controller to determine when averaging of aberration measurements should be initiated, and the form of that averaging, may be the elapsed time since the lithographic apparatus was switched back on.

In an embodiment, the method may make a selection between the three different methods shown in FIGS. 3 to 5 (or variations of these methods), the selection depending upon the nature of a change of machine state. In general, the manner in which averaging of the aberration measurement is introduced, and the number of aberration measurements which are used to generate averages, may be selected depending upon the nature of the change of machine state.

Embodiments of the invention may adjust the frequency of aberration measurements to take into account the expected rate of change of aberrations. For example, the rate of change of aberrations may be expected to reduce once 20 lots of substrates have been exposed without a change of machine state. The method could consequently switch to performing aberration measurements after exposure of every second lot of substrates instead of after every lot of substrates. In another example, immediately after a change of machine state intra-lot aberration measurements may be performed (e.g. after every $5^{th}$ substrate of a 25 substrate lot). After a predetermined number of lots has been exposed the number of lots between intra-lot aberration measurements may be increased, or intra-lot aberration measurements may be discontinued.

In general, a reduction of the rate of aberration measurement may take place once a predetermined number of lots (or substrates) has been exposed without a change of machine state. This is advantageous because it will improve the throughput of the lithographic apparatus (i.e. the number of substrates that are patterned per hour). The reduction of rate of aberration measurement may take into account the nature of the change of machine state. For example, aberrations may be expected to stabilise relatively quickly following a change of mask and relatively slowly following machine maintenance).

In an embodiment the aberration correction may eventually be switched off. This may be appropriate for example if the lithographic apparatus is being used to project the same pattern onto substrates for a long period of time (e.g. of the order of days or weeks). In such a situation, application process control (APC), which comprises periodic measurement of patterns exposed on substrates, may be used to monitor and correct for changes in the aberration caused by the projection system. It may take several hours for an APC measurement to be performed (the substrate is exposed and then processed before measurement of the exposed pattern takes place). However, if the projection system aberration changes at a rate which is slower than the frequency of the APC measurements, then APC is sufficient to control the projection system aberration. APC may provide a more accurate aberration measurement than is provided by the sensor S, and thus it may be preferable to use APC when the rate of change of aberrations is slower than the frequency of APC measurements.

In an embodiment, phasing out of the aberration correction determined by the sensor S and controller CT may be performed by averaging the measured aberration over more and more measurements and then finally switching off the aberration measurement and correction loop when a maximum number of measurements have been reached (e.g. averaging over 100 lots of substrates).

In an alternative embodiment, phasing out of the aberration correction determined by the sensor S and controller CT may take place when the controller determines that the rate of change of aberrations is slower than a predetermined threshold. The predetermined threshold may for example correspond with a rate of change of aberration that is slower than the time taken for APC measurements, such that APC is sufficient to control the projection system aberration.

In an alternative embodiment, phasing out of the aberration correction determined by the sensor S and controller CT may take place when the controller determines based on the time elapsed since a change of machine state (e.g. a number of hours or days after a machine state change).

In general, the controller CT may use multiple parameters to monitor progress of the lithographic apparatus following a change of machine state. For example, the number of lot exposures (or substrate exposures) since the change of machine state and the elapsed time since the change of machine state may both be monitored. Both of the monitored parameters may be used by the controller when determining the manner in which the aberration correction should be calculated and applied. For example, the form of averaging used to generate an averaged aberration measurement may be determined based on the number of lot exposures (or substrate exposures) since the change of machine state. Phasing out (or partial phasing out) of the aberration correction may be determined based on the elapsed time since the change of machine state.

Partial phasing out of the aberration correction may be used (e.g. as mentioned above). For example, a weighting may be applied to the aberration correction applied to the projection system, the weighting reducing as the time elapsed since a change of machine state increases. For example, the weighting may reduce over time from 100% to 0%. Alternatively, the weighting may reduce over time to a non-zero value (e.g. 30% or some other suitable value).

In an embodiment, the controller may include an interface which allows a user of the lithographic apparatus to input parameter values to be used by the method. These may for example comprise the number of lots (or wafers) which must be exposed without a change of machine state before averaging of aberration measurements occurs. They may comprise the number of aberration measurements which are used to generate an average measurement. They may comprise the elapsed time since a change of machine state following which aberration correction using aberrations measured using the sensor is switched off.

The lithographic apparatus may use feed-forward values to adjust the projection system. That is, the projection system may be adjusted to take into account aberrations that are expected to occur based upon a model of the behaviour of the projection system. Adjustments of the projection system may use feed-forward values in addition to using feed-back values in the manner described above. A weighting may be applied to feed-forward values and a weighting may be applied to feed-back values when calculating adjustments to be applied to the projection system. Embodiments of the invention may adjust the relative sizes of the weightings taking into account the number of lots (or number of substrates) that have been exposed since a change of machine state. For example, the relative weight given to feed-forward values may be reduced as the number of exposed lots (or number of exposed substrates) increases. The relative weight given to feed-forward values may be reduced to zero after a predetermined number of exposed lots (or number of exposed substrates) is reached, in which case no feed-forward correction is applied to the projection system.

Although the above description refers to adjustment of the projection system to correct for aberrations caused by the projection system, other adjustments of the lithographic apparatus may be applied. For example, displacement of the focal plane of the projection system in the z-direction (which may be considered to be a form of aberration) may be corrected for by adjusting the wavelength of radiation provided by the source SO. For example, the positions of the mask MA and/or substrate W may be adjusted to correct for lateral displacement of an image.

Although embodiments of the invention have been described in terms of a lithographic apparatus having a transmissive projection system, the invention may also be applicable to lithographic apparatus having a reflective projection system (e.g. EUV lithographic apparatus).

Aspects of the invention can be implemented in any convenient form. For example computer programs may be provided to carry out the methods described herein. Such computer programs may be carried on appropriate computer readable media which term includes appropriate tangible storage devices (e.g. discs).

While specific embodiments of the invention have been described above, it will be appreciated that the invention may be practiced otherwise than as described. The description is not intended to limit the invention.

The invention claimed is:

1. A method of correcting aberrations caused by a projection system of a lithographic apparatus, the method comprising:
    performing a measurement of an aberration caused by the projection system using a sensor located in the lithographic apparatus;
    determining, based on a history of operation of the lithographic apparatus since a change of machine state, whether to average the measured aberration with one or more aberration measurements previously obtained using the sensor;
    calculating a correction to be applied to the lithographic apparatus using the measured aberration if it is determined that averaging should not be performed;
    calculating a correction to be applied to the lithographic apparatus using an averaged aberration measurement if it is determined that averaging should be performed; and
    applying the calculated correction to the lithographic apparatus.

2. The method of claim 1, wherein the history of operation of the lithographic apparatus comprises a number of substrates or lots of substrates exposed by the lithographic apparatus since a change of machine state of the lithographic apparatus.

3. The method of claim 1, wherein the history of operation of the lithographic apparatus comprises elapsed time since a change of machine state of the lithographic apparatus.

4. The method of claim 1, wherein a nature of the change of machine state is taken into account when determining whether to average the measured aberration with one or more previously measured aberrations.

5. The method of claim 1, wherein a nature of the change of machine state is taken into account when determining the manner in which the averaged aberration measurement is calculated.

6. The method of claim 1, wherein the change of machine state of the lithographic apparatus comprises one or more selected from: an interruption of operation of the lithographic apparatus, a change of illumination mode, a change of mask, a change of lot size, and/or a change of radiation dose.

7. The method of claim 1, wherein if no aberration measurement has been performed since a change of machine state has occurred then averaging of measured aberrations is not performed.

8. The method of claim 1, wherein the averaged aberration measurement is a rolling average of aberration measurements.

9. The method of claim 1, wherein the averaged aberration measurement is an average of all aberration measurements performed since the change of machine state occurred.

10. The method of claim 1, wherein the correction is applied to a projection system of the lithographic apparatus.

11. The method of claim 1, further comprising ceasing to apply a correction calculated using one or more aberration measurements performed using the sensor when a predetermined time has elapsed since the change of machine state.

12. The method of claim 1, further comprising ceasing to apply a correction calculated using one or more aberration measurements performed using the sensor when a predetermined number of substrates or lots of substrates has been exposed by the lithographic apparatus since the change of machine state.

13. The method of claim 1, further comprising ceasing to apply a correction calculated using one or more aberration measurements performed using the sensor when a rate of change of aberrations is slower than a predetermined threshold.

14. The method of claim 1, wherein a weighting is applied to the calculated correction, the weighting decreasing as the number of substrates or lots of substrates exposed by the lithographic apparatus since the change of machine state increases, or as the elapsed time since the change of machine state increases.

15. The method of claim 1, wherein a series of lots of substrates are exposed, and wherein the aberration measurement is performed before exposure of each lot of substrates.

16. The method of claim 1, wherein a rate at which aberration measurements are performed using the sensor is adjusted based upon the history of operation of the lithographic apparatus since a change of machine state.

17. The method of claim 1, wherein the calculation of the correction to be applied to the projection system takes into account feed-forward values based upon expected changes of the aberrations caused by the projection system.

18. A non-transitory computer readable medium carrying a computer program comprising computer readable instructions configured to cause a processor to:
   obtain a measurement of an aberration caused by a projection system of a lithographic apparatus using a sensor located in the lithographic apparatus;
   determine, based on a history of operation of the lithographic apparatus since a change of machine state, whether to average the measured aberration with one or more aberration measurements previously obtained using the sensor;
   calculate a correction to be applied to the lithographic apparatus using the measured aberration if it is determined that averaging should not be performed;
   calculate a correction to be applied to the lithographic apparatus using an averaged aberration measurement if it is determined that averaging should be performed; and
   cause application of the calculated correction to the lithographic apparatus.

19. A lithographic apparatus comprising a projection system, a sensor configured to measure aberrations, and a controller, wherein the controller is configured to:
   use the sensor to perform a measurement of an aberration caused by the projection system;
   determine, based on a history of operation of the lithographic apparatus since a change of machine state, whether to average the measured aberration with one or more aberration measurements previously obtained using the sensor;
   calculate a correction to be applied to the lithographic apparatus using the measured aberration if it is determined that averaging should not be performed;
   calculate a correction to be applied to the lithographic apparatus using an averaged aberration measurement if it is determined that averaging should be performed; and
   apply the calculated correction to the lithographic apparatus.

20. The lithographic apparatus of claim 19, wherein the history of operation of the lithographic apparatus comprises a number of substrates or lots of substrates exposed by the lithographic apparatus since a change of machine state of the lithographic apparatus.

* * * * *